(12) United States Patent
Eaton et al.

(10) Patent No.: US 8,993,414 B2
(45) Date of Patent: Mar. 31, 2015

(54) LASER SCRIBING AND PLASMA ETCH FOR HIGH DIE BREAK STRENGTH AND CLEAN SIDEWALL

(71) Applicant: Applied Materials, Inc., Santa Clara, CA (US)

(72) Inventors: Brad Eaton, Menlo Park, CA (US); Saravjeet Singh, Santa Clara, CA (US); Wei-Sheng Lei, San Jose, CA (US); Madhava Rao Yalamanchili, Morgan Hill, CA (US); Tong Liu, San Jose, CA (US); Ajay Kumar, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/938,570

(22) Filed: Jul. 10, 2013

(65) Prior Publication Data
US 2014/0017881 A1    Jan. 16, 2014

Related U.S. Application Data

(60) Provisional application No. 61/791,048, filed on Mar. 15, 2013, provisional application No. 61/671,637, filed on Jul. 13, 2012.

(51) Int. Cl.
*H01L 21/78* (2006.01)
*H01L 21/3065* (2006.01)

(52) U.S. Cl.
CPC ............ *H01L 21/78* (2013.01); *H01L 21/3065* (2013.01); *H01L 21/30655* (2013.01)
USPC ......................................................... 438/465

(58) Field of Classification Search
CPC ................. H01L 2924/00; H01L 21/78; H01L 2924/00014; H01L 2224/32225; H01L 2924/0002

USPC .......................................................... 438/465
See application file for complete search history.

(56) References Cited

U.S. PATENT DOCUMENTS

| | | |
|---|---|---|
| 4,049,944 A | 9/1977 | Garvin et al. |
| 5,244,538 A | 9/1993 | Kumar |

(Continued)

FOREIGN PATENT DOCUMENTS

| | | |
|---|---|---|
| JP | 9216085 | 8/1997 |
| JP | 10321908 | 12/1998 |

(Continued)

OTHER PUBLICATIONS

Linder, V. et al., "Water-Soluble Sacrificial Layers for Surface", www.small-journal.com, 2005, 1, No. 7, 7 Pages.

(Continued)

*Primary Examiner* — Tony Tran
(74) *Attorney, Agent, or Firm* — Blakely Sokoloff Taylor Zafman LLP (57) ABSTRACT

In embodiments, a hybrid wafer or substrate dicing process involving an initial laser scribe and subsequent plasma etch is implemented for die singulation. The laser scribe process may be used to cleanly remove a mask layer, organic and inorganic dielectric layers, and device layers. The laser etch process may then be terminated upon exposure of, or partial etch of, the wafer or substrate. In embodiments, a multi-plasma etching approach is employed to dice the wafers where an isotropic etch is employed to improve the die sidewall following an anisotropic etch. The isotropic etch removes anisotropic etch byproducts, roughness, and/or scalloping from the anisotropically etched die sidewalls after die singulation.

18 Claims, 6 Drawing Sheets

(56) References Cited

U.S. PATENT DOCUMENTS

| | | | |
|---|---|---|---|
| 5,593,606 A | 1/1997 | Owen et al. | |
| 6,057,180 A | 5/2000 | Sun et al. | |
| 6,174,271 B1 | 1/2001 | Kosmowski et al. | |
| 6,194,284 B1 | 2/2001 | Chen | |
| 6,306,731 B1 | 10/2001 | Igarashi et al. | |
| 6,407,363 B2 | 6/2002 | Dunsky et al. | |
| 6,465,158 B1 | 10/2002 | Sekiya | |
| 6,485,988 B2 * | 11/2002 | Ma et al. | 438/3 |
| 6,528,864 B1 | 3/2003 | Arai | |
| 6,574,250 B2 | 6/2003 | Sun et al. | |
| 6,582,983 B1 | 6/2003 | Runyon et al. | |
| 6,593,542 B2 | 7/2003 | Baird et al. | |
| 6,642,127 B2 | 11/2003 | Kumar et al. | |
| 6,676,878 B2 | 1/2004 | O'Brien et al. | |
| 6,696,669 B2 | 2/2004 | Hembree et al. | |
| 6,706,998 B2 | 3/2004 | Cutler et al. | |
| 6,759,275 B1 | 7/2004 | Lee et al. | |
| 6,803,247 B2 | 10/2004 | Sekiya | |
| 6,887,804 B2 | 5/2005 | Sun et al. | |
| 6,998,571 B2 | 2/2006 | Sekiya et al. | |
| 7,128,806 B2 | 10/2006 | Nguyen et al. | |
| 7,129,150 B2 | 10/2006 | Kawai | |
| 7,179,723 B2 | 2/2007 | Genda et al. | |
| 7,265,033 B2 | 9/2007 | Shigematsu et al. | |
| 7,364,986 B2 | 4/2008 | Nagai et al. | |
| 7,435,607 B2 | 10/2008 | Nagai | |
| 7,459,377 B2 | 12/2008 | Ueda et al. | |
| 7,468,309 B2 | 12/2008 | Shigematsu et al. | |
| 7,473,866 B2 | 1/2009 | Morishige et al. | |
| 7,507,639 B2 | 3/2009 | Nakamura | |
| 7,629,228 B2 | 12/2009 | Haji et al. | |
| 7,678,670 B2 | 3/2010 | Arita et al. | |
| 7,687,740 B2 | 3/2010 | Bruland et al. | |
| 7,754,584 B2 | 7/2010 | Kumakawa | |
| 7,767,551 B2 | 8/2010 | Arita et al. | |
| 7,767,554 B2 | 8/2010 | Arita et al. | |
| 7,776,720 B2 | 8/2010 | Boyle et al. | |
| 7,838,323 B2 | 11/2010 | Utsumi et al. | |
| 7,859,084 B2 | 12/2010 | Utsumi et al. | |
| 7,875,898 B2 | 1/2011 | Maeda | |
| 7,906,410 B2 * | 3/2011 | Arita et al. | 438/462 |
| 7,923,351 B2 | 4/2011 | Arita | |
| 7,927,973 B2 | 4/2011 | Haji et al. | |
| 2001/0035401 A1 | 11/2001 | Manor | |
| 2003/0034325 A1 * | 2/2003 | Hart et al. | 216/27 |
| 2003/0162313 A1 | 8/2003 | Kim et al. | |
| 2004/0080045 A1 | 4/2004 | Kimura et al. | |
| 2004/0137700 A1 | 7/2004 | Sekiya | |
| 2006/0043535 A1 | 3/2006 | Hiatt | |
| 2006/0205182 A1 | 9/2006 | Soejima | |
| 2009/0255911 A1 | 10/2009 | Krishnaswami et al. | |
| 2010/0048001 A1 | 2/2010 | Harikai et al. | |
| 2010/0096256 A1 * | 4/2010 | Nalamasu et al. | 204/192.34 |
| 2010/0120227 A1 * | 5/2010 | Grivna et al. | 438/462 |
| 2010/0120230 A1 | 5/2010 | Grivna et al. | |
| 2011/0312157 A1 | 12/2011 | Lei et al. | |
| 2012/0009795 A1 | 1/2012 | Endou et al. | |
| 2012/0240999 A1 * | 9/2012 | Yoshida et al. | 136/256 |
| 2013/0017668 A1 * | 1/2013 | Lei et al. | 438/462 |
| 2013/0221377 A1 * | 8/2013 | Ward | 257/77 |

FOREIGN PATENT DOCUMENTS

| | | |
|---|---|---|
| JP | 2001127011 | 5/2001 |
| JP | 2001144126 | 5/2001 |
| JP | 2003179005 | 6/2003 |
| JP | 2004031526 | 1/2004 |
| JP | 2004055684 | 2/2004 |
| WO | WO-03036712 | 5/2003 |
| WO | WO-03071591 | 5/2003 |
| WO | WO-2012173759 | 12/2012 |

OTHER PUBLICATIONS

Singh, Saravjeet et al., "Apparatus and Methods for Dry Etch With Edge, Side and Back Protection", U.S. Appl. No. 61/491,693, filed May 31, 2011 24 Pages.

International Search Report and Written Opinion from PCT/US2013/050122 mailed Oct. 18, 2013, 10 pages.

Supplementary International Search Report dated Oct. 31, 2014, in International Patent Application No. PCT/US2013/050122, 7 pages.

* cited by examiner

LASER SCRIBING AND PLASMA ETCH FOR HIGH DIE BREAK STRENGTH AND CLEAN SIDEWALL

CROSS REFERENCE TO RELATED APPLICATIONS

This application claims the benefit of priority to U.S. Provisional Application No. 61/791,048 filed on Mar. 15, 2013, titled "LASER SCRIBING AND PLASMA ETCH FOR HIGH DIE BREAK STRENGTH AND CLEAN SIDEWALL," and U.S. Provisional Application No. 61/671,637 filed on Jul. 13, 2012, titled "LASER SCRIBING AND PLASMA ETCH FOR HIGH DIE BREAK STRENGTH AND CLEAN SIDEWALL," the entire contents of which are hereby incorporated by reference in their entirety for all purposes.

BACKGROUND

1) Field

Embodiments of the present invention pertain to the field of semiconductor processing and, in particular, to methods of dicing semiconductor wafers, each wafer having a plurality of integrated circuits thereon.

2) Description of Related Art

In semiconductor wafer processing, integrated circuits are formed on a wafer (also referred to as a substrate) composed of silicon or other semiconductor material. In general, layers of various materials which are either semiconducting, conducting or insulating are utilized to form the integrated circuits. These materials are doped, deposited and etched using various well-known processes to form integrated circuits. Each wafer is processed to form a large number of individual regions containing integrated circuits known as dice or dies.

Following the integrated circuit formation process, the wafer is "diced" to separate the individual die from one another for packaging or for use in an unpackaged form within larger circuits. The two main techniques that are used for wafer dicing are scribing and sawing. With scribing, a diamond tipped scribe is moved across the wafer surface along pre-formed scribe lines. These scribe lines extend along the spaces between the dies. These spaces are commonly referred to as "streets." The diamond scribe forms shallow scratches in the wafer surface along the streets. Upon the application of pressure, such as with a roller, the wafer separates along the scribe lines. The breaks in the wafer follow the crystal lattice structure of the wafer substrate. Scribing can be used for wafers that are about 10 mils (thousandths of an inch) or less in thickness. For thicker wafers, sawing is presently the preferred method for dicing.

With sawing, a diamond tipped saw rotating at high revolutions per minute contacts the wafer surface and saws the wafer along the streets. The wafer is mounted on a supporting member such as an adhesive film stretched across a film frame and the saw is repeatedly applied to both the vertical and horizontal streets. One problem with either scribing or sawing is that chips and gouges can form along the severed edges of the dice. In addition, cracks can form and propagate from the edges of the dies into the substrate and render the integrated circuit inoperative. Chipping and cracking are particularly a problem with scribing because only one side of a square or rectangular die can be scribed in the direction of the crystalline structure. Consequently, cleaving of the other side of the die results in a jagged separation line. Because of chipping and cracking, additional spacing is required between the dies on the wafer to prevent damage to the integrated circuits, e.g., the chips and cracks are maintained at a distance from the actual integrated circuits. As a result of the spacing requirements, not as many dies can be formed on a standard sized wafer and wafer real estate that could otherwise be used for circuitry is wasted. The use of a saw exacerbates the waste of real estate on a semiconductor wafer. The blade of the saw is approximate 15 microns thick. As such, to insure that cracking and other damage surrounding the cut made by the saw does not harm the integrated circuits, three to five hundred microns often must separate the circuitry of each of the dies. Furthermore, after cutting, each die requires substantial cleaning to remove particles and other contaminants that result from the sawing process.

Plasma dicing has also been used, but may have limitations as well. For example, one limitation hampering implementation of plasma dicing may be cost. A standard lithography operation for patterning resist may render implementation cost prohibitive. Another limitation possibly hampering implementation of plasma dicing is that plasma processing of commonly encountered metals (e.g., copper) in dicing along streets can create production issues or throughput limits.

SUMMARY

One or more embodiments of the invention are directed to methods of dicing a semiconductor wafer including a plurality of integrated circuits (ICs).

In one embodiment, a method of dicing a semiconductor wafer including a plurality of integrated circuits involves forming a mask above the semiconductor wafer. The mask covers and protects the integrated circuits. The method also involves patterning the mask with a laser scribing process to provide a patterned mask with gaps, exposing regions of the semiconductor wafer between the integrated circuits. The method also involves anisotropically etching the semiconductor wafer through the gaps in the patterned mask to advance an etched trench completely through the substrate to singulate the integrated circuits. The method also involves isotropically etching the anisotropically etched trench.

One or more embodiments are directed to a system for dicing a substrate comprising a plurality of ICs. In one embodiment, the system includes a laser scribe module to pattern a multi-layered mask and expose regions of a substrate between the ICs. The system also includes an anisotropic plasma etch module physically coupled to the laser scribe module to anisotropically etch through a thickness of the substrate remaining after laser scribing. The system also includes an isotropic plasma etch module physically coupled to the laser scribe module to isotropically etch the anisotropically etched trench. The system also includes a robotic transfer chamber to transfer the laser scribed substrate from the laser scribe module to the anisotropic plasma etch module.

BRIEF DESCRIPTION OF THE DRAWINGS

Embodiments of the present invention are illustrated by way of example, and not by way of limitation, and can be more fully understood with reference to the following detailed description when considered in connection with the figures in which.

DETAILED DESCRIPTION

Methods of dicing semiconductor wafers, each wafer having a plurality of integrated circuits thereon, are described. In the following description, numerous specific details are set forth, such as laser and plasma etch wafer dicing approaches in order to provide a thorough understanding of embodiments of the present invention. It will be apparent to one skilled in the art that embodiments of the present invention may be practiced without these specific details. In other instances, well-known aspects, such as integrated circuit fabrication, are not described in detail in order to not unnecessarily obscure embodiments of the present invention. Furthermore, it is to be understood that the various embodiments shown in the Figures are illustrative representations and are not necessarily drawn to scale.

In embodiments, a hybrid wafer or substrate dicing process involving an initial laser scribe and subsequent plasma etch is implemented for die singulation. The laser scribe process may be used to cleanly remove a mask layer, organic and inorganic dielectric layers, and device layers. The laser etch process may then be terminated upon exposure of, or partial etch of, the wafer or substrate. The plasma etch portion of the dicing process may then be employed to etch through the bulk of the wafer or substrate, such as through bulk single crystalline silicon, to yield die or chip singulation or dicing.

In embodiments, a multi-plasma etching approach is employed to dice the wafers in which an isotropic etch is employed to improve the die sidewall following an anisotropic singulation etch. The laser scribing removes difficult-to-etch passivation layers, dielectric and metal layers until the underlying silicon substrate is exposed. Anisotropic plasma etching is then used to generate trenches of depth to the target die thickness. Finally, the isotropic etch removes anisotropic etch byproducts, roughness, and/or scalloping from the anisotropically etched die sidewalls after die singulation. In one embodiment, the resulting singulated dies have higher die break strengths (relative to singulated dies not exposed to a final isotropic etch) to ensure reliable die pick and place and subsequent assembly processes. In an embodiment, die sidewalls are cleaned of carbon (C) or flourine (F) elements, which can otherwise adversely impact adhesion properties of dies in subsequent packaging process causing low reliability. Rough sidewalls (e.g., untreated sidewalls) can also reduce die break strength (e.g., via lower crack activation energies).

Figure 1:
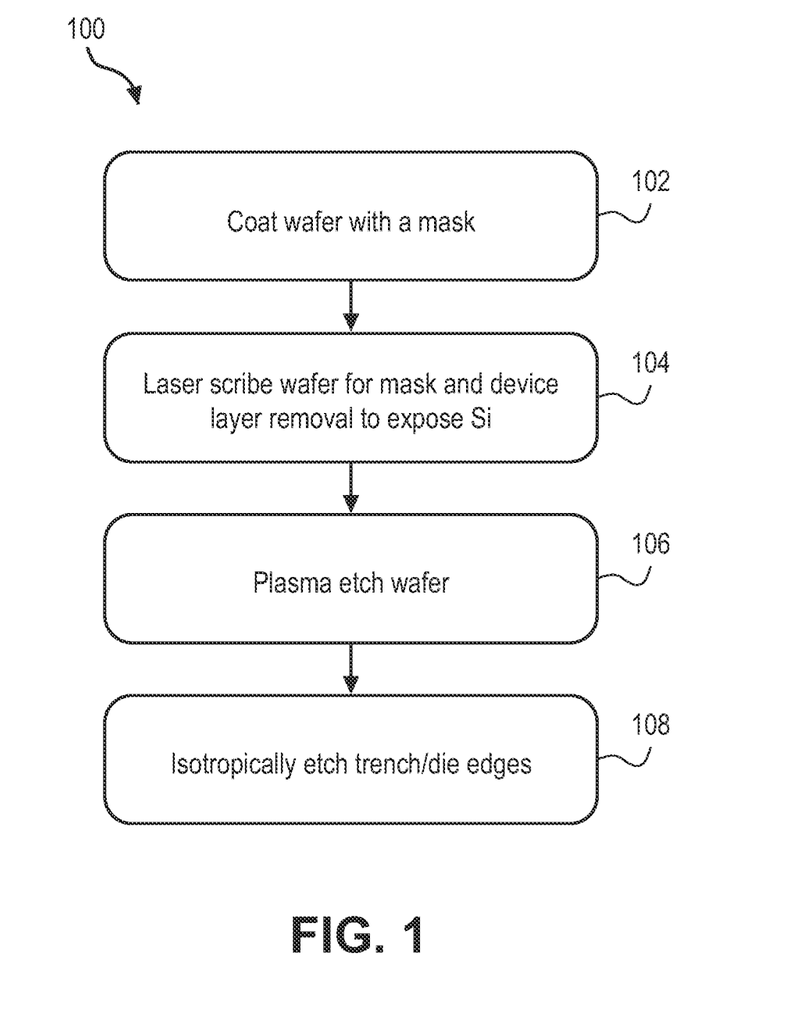
FIG. 1 is a flowchart representing operations in a method of dicing a semiconductor wafer including a plurality of integrated circuits, in accordance with an embodiment of the present invention.

FIG. 1 illustrates operations in a method of dicing a semiconductor wafer including a plurality of integrated circuits, in accordance with an embodiment of the present invention. FIGS. 2A-2D illustrate cross-sectional views of a semiconductor wafer including a plurality of integrated circuits during performance of the methods.

Figure 2A:
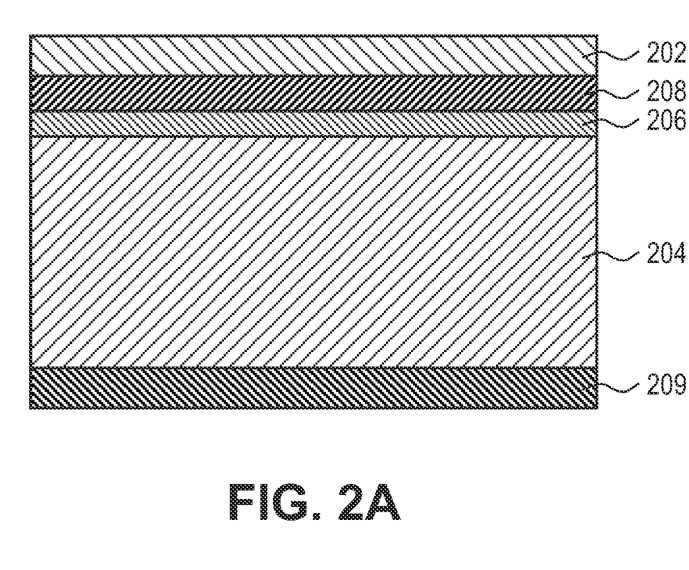
FIGS. 2A, 2B, 2C, and 2D illustrate cross-sectional views of a semiconductor wafer including a plurality of integrated circuits during performance of a method of dicing the semiconductor wafer, corresponding to operations of FIG. 1, in accordance with embodiments of the present invention.

During the first operation 102 of the method 100 in FIG. 1, and corresponding to FIG. 2A, a front side mask 202 is formed above a semiconductor wafer or substrate 204. According to one embodiment, the semiconductor wafer or substrate 204 has a diameter of at least 300 mm and has a thickness of 300 μm to 800 μm. In one embodiment, the semiconductor substrate 204 has a diameter of 10 μm to 800 μm. As illustrated, in an embodiment, the mask is a conformal mask. Conformal mask embodiments advantageously ensure sufficient thickness of the mask over an underlying topography (e.g., 20 μm bumps, not shown) to survive the duration of a plasma etch dicing operation. In alternative embodiments, however, the mask is a non-conformal, planarized mask (e.g., thickness of the mask over a bump is less than thickness of the mask in a valley). Formation of a conformal mask may be by CVD, for example, or by any other process known in the art. In one embodiment, the mask 202 covers and protects integrated circuits (ICs) formed on the surface of semiconductor wafer and also protects bump projecting or protruding up 10-20 μm from the surface of the semiconductor wafer. The mask 202 also covers intervening streets formed between adjacent ones of the integrated circuits.

In accordance with an embodiment of the present invention, forming the mask 202 includes forming a layer such as, but not limited to, a water-soluble layer (PVA, etc.), and/or a photo-resist layer, and/or an I-line patterning layer. For example, a polymer layer such as a photo-resist layer may be composed of a material otherwise suitable for use in a lithographic process. In embodiments with multiple mask layers, a water-soluble base coat may be disposed below a non-water-soluble overcoat. The basecoat then provides a means of stripping the overcoat while the overcoat provides plasma etch resistance and/or for good mask ablation by the laser scribing process. It has been found for example, that mask materials transparent to the laser wavelength employed in the scribing process contribute to low die edge strength. Hence, a water-soluble base coat, of PVA, for example, as the first mask material layer, may function as a means of undercutting a plasma-resistant/laser energy absorbing overcoat layer of the mask so that the entire mask may be removed/lifted off from the underlying integrated circuit (IC) thin film layer. The water-soluble base coat may further serve as a barrier protecting the IC thin film layer from the process used to strip the energy absorbing mask layer. In embodiments, the laser energy absorbing mask layer is UV-curable and/or UV absorbing, and/or green-band (500-540 nm) absorbing. Exemplary materials include many photo-resists and polyimide (PI) materials conventionally employed for passivation layers of IC chips. In one embodiment, the photo-resist layer is composed of a positive photo-resist material such as, but not limited to, a 248 nanometer (nm) resist, a 193 nm resist, a 157 nm resist, an extreme ultra-violet (EUV) resist, or a phenolic resin matrix with a diazonaphthoquinone sensitizer. In another embodiment, the photo-resist layer is composed of a negative photo-resist material such as, but not limited to, poly-cis-isoprene and poly-vinyl-cinnamate.

Referring again to FIG. 2A, the semiconductor wafer or substrate 204 has disposed thereon or therein, as a portion of the integrated circuits 206, an array of semiconductor devices. Examples of such semiconductor devices include, but are not limited to, memory devices or complimentary metal-oxide-semiconductor (CMOS) transistors fabricated in a silicon substrate and encased in a dielectric layer. A plurality of metal interconnects may be formed above the devices or transistors, and in surrounding dielectric layers, and may be used to electrically couple the devices or transistors to form the integrated circuits. Conductive bumps and passivation layers 208 may be formed above the interconnect layers. Materials making up the streets may be similar to or the same as those materials used to form the integrated circuits. For example, streets may be composed of layers of dielectric materials, semiconductor materials, and metallization. In one embodiment, one or more of the streets includes test devices similar to the actual devices of the integrated circuits.

Figure 2B:
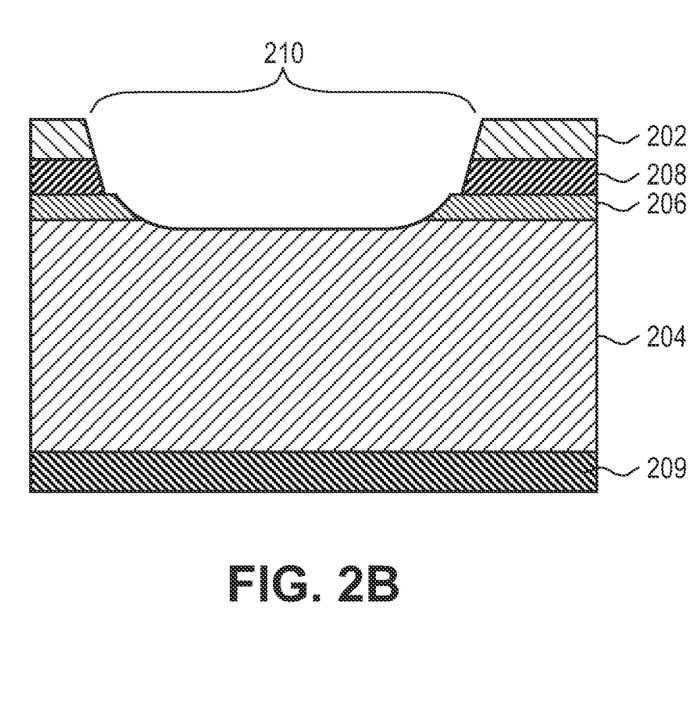

Returning to FIG. 1, and turning to corresponding FIG. 2B, the method 100 proceeds with bulk target layer material removal at operation 104. To minimize dielectric delamination and cracking, a femtosecond laser is preferred. However, depending on the device structure, an ultraviolet (UV), picosecond, or nanosecond laser source can also be applied. The laser has a pulse repetition frequency in the range of 80 kHz to 1 MHz, ideally in the range of 100 kHz to 500 kHz.

Referring again to FIG. 2B, the laser scribing process is performed generally to remove the material of the streets present between the integrated circuits 206. In accordance with an embodiment of the present invention, patterning the mask 202 with the laser scribing process includes forming trenches 210 partially into the regions of the semiconductor wafer between the integrated circuits. In an embodiment, patterning the mask with the laser scribing process includes direct writing a pattern using a laser having a pulse width in the femtosecond range.

Specifically, a laser with a wavelength in the visible spectrum or the ultra-violet (UV) or infra-red (IR) ranges (the three totaling a broadband optical spectrum) may be used to provide a femtosecond-based laser, i.e., a laser with a pulse width on the order of the femtosecond ($10^{-15}$ seconds). In one embodiment, ablation is not, or is essentially not, wavelength dependent and is thus suitable for complex films such as films of the mask, the streets and, possibly, a portion of the semiconductor wafer or substrate.

Laser parameters selection, such as pulse width, may be critical to developing a successful laser scribing and dicing process that minimizes chipping, microcracks, and delamination in order to achieve clean laser scribe cuts. The cleaner the laser scribe cut, the smoother an etch process that may be performed for ultimate die singulation. In semiconductor device wafers, many functional layers of different material types (e.g., conductors, insulators, semiconductors) and thicknesses are typically disposed thereon. Such materials may include, but are not limited to, organic materials such as polymers, metals, or inorganic dielectrics such as silicon dioxide and silicon nitride.

Figure 3:
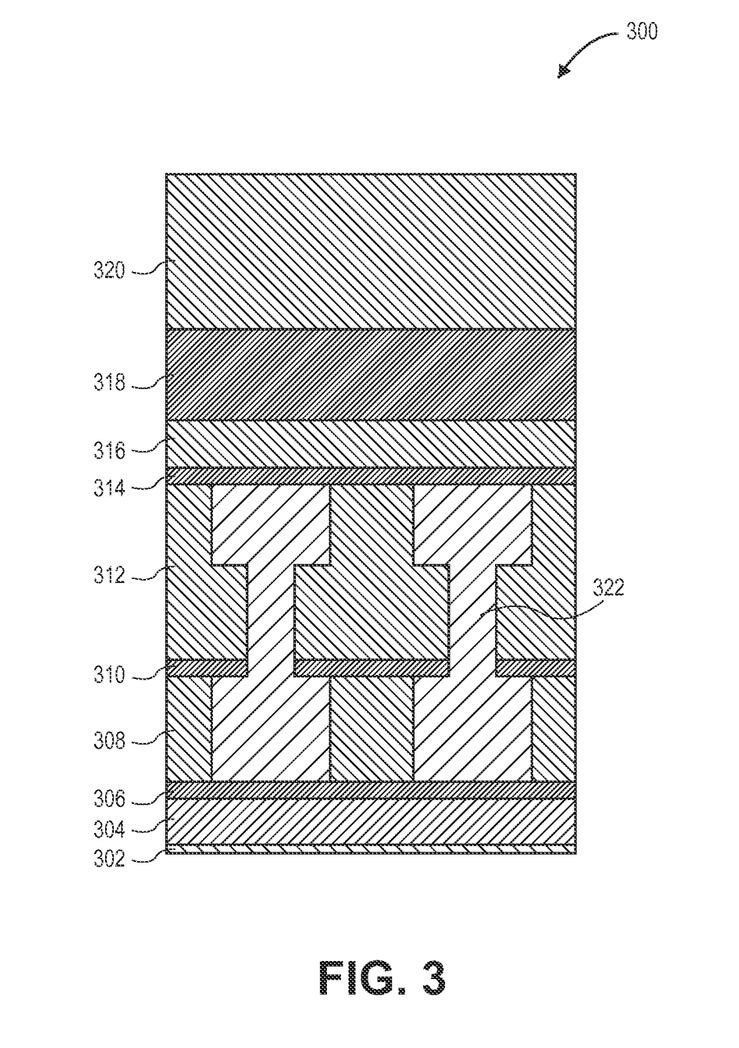
FIG. 3 illustrates a cross-sectional view of a stack of materials that may be present in a street region of a semiconductor wafer or substrate, in accordance with embodiments of the present invention.

A street between individual integrated circuits disposed on a wafer or substrate may include the similar or same layers as the integrated circuits themselves. For example, FIG. 3 illustrates a cross-sectional view of a stack of materials that may be used in a street region of a semiconductor wafer or substrate, in accordance with an embodiment of the present invention. Referring to FIG. 3, a street region 300 includes the top portion 302 of a silicon substrate, a first silicon dioxide layer 304, a first etch stop layer 306, a first low K dielectric layer 308 (e.g., having a dielectric constant of less than the dielectric constant of 4.0 for silicon dioxide), a second etch stop layer 310, a second low K dielectric layer 312, a third etch stop layer 314, an undoped silica glass (USG) layer 316, a second silicon dioxide layer 318, and a layer of photo-resist 320 or some other mask. Copper metallization 322 is disposed between the first and third etch stop layers 306 and 314 and through the second etch stop layer 310. In a specific embodiment, the first, second and third etch stop layers 306, 310 and 314 are composed of silicon nitride, while low K dielectric layers 308 and 312 are composed of a carbon-doped silicon oxide material.

Under conventional laser irradiation (such as nanosecond-based or picosecond-based laser irradiation), the materials of street 300 may behave quite differently in terms of optical absorption and ablation mechanisms. For example, dielectrics layers such as silicon dioxide, is essentially transparent to all commercially available laser wavelengths under normal conditions. By contrast, metals, organics (e.g., low K materials) and silicon can couple photons very easily, particularly in response to nanosecond-based or picosecond-based laser irradiation. In an embodiment, however, a femtosecond-based laser process is used to pattern a layer of silicon dioxide, a layer of low K material, and a layer of copper by ablating the layer of silicon dioxide prior to ablating the layer of low K material and the layer of copper. In a specific embodiment, pulses of approximately less than or equal to 400 femtoseconds are used in a femtosecond-based laser irradiation process to remove a mask, a street, and a portion of a silicon substrate. In one embodiment, pulses of approximately less than or equal to 500 femtoseconds are used.

In accordance with an embodiment of the present invention, suitable femtosecond-based laser processes are characterized by a high peak intensity (irradiance) that usually leads to nonlinear interactions in various materials. In one such embodiment, the femtosecond laser sources have a pulse width approximately in the range of 10 femtoseconds to 500 femtoseconds, although preferably in the range of 100 femtoseconds to 400 femtoseconds. In one embodiment, the femtosecond laser sources have a wavelength approximately in the range of 1570 nanometers to 200 nanometers, although preferably in the range of 540 nanometers to 250 nanometers. In one embodiment, the laser and corresponding optical system provide a focal spot at the work surface approximately in the range of 3 microns to 15 microns, though preferably approximately in the range of 5 microns to 10 microns.

The spacial beam profile at the work surface may be a single mode (Gaussian) or have a shaped top-hat profile. In an embodiment, the laser source has a pulse repetition rate approximately in the range of 200 kHz to 10 MHz, although preferably approximately in the range of 500 kHz to 5 MHz. In an embodiment, the laser source delivers pulse energy at the work surface approximately in the range of 0.5 µJ to 100 µJ, although preferably approximately in the range of 1 µJ to 5 µJ. In an embodiment, the laser scribing process runs along a work piece surface at a speed approximately in the range of 500 mm/sec to 5 m/sec, although preferably approximately in the range of 600 mm/sec to 2 m/sec.

The scribing process may be run in single pass only, or in multiple passes, but, in an embodiment, preferably 1-2 passes. In one embodiment, the scribing depth in the work piece is approximately in the range of 5 microns to 50 microns deep, preferably approximately in the range of 10 microns to 20 microns deep. The laser may be applied either in a train of single pulses at a given pulse repetition rate or a train of pulse bursts. In an embodiment, the kerf width of the laser beam generated is approximately in the range of 2 microns to 15 microns, although in silicon wafer scribing/dicing preferably approximately in the range of 6 microns to 10 microns, measured at the device/silicon interface.

Laser parameters may be selected with benefits and advantages such as providing sufficiently high laser intensity to achieve ionization of inorganic dielectrics (e.g., silicon dioxide) and to minimize delamination and chipping caused by underlayer damage prior to direct ablation of inorganic dielectrics. Also, parameters may be selected to provide meaningful process throughput for industrial applications with precisely controlled ablation width (e.g., kerf width) and depth. As described above, a femtosecond-based laser is far more suitable to providing such advantages, as compared with picosecond-based and nanosecond-based laser ablation processes. However, even in the spectrum of femtosecond-based laser ablation, certain wavelengths may provide better performance than others. For example, in one embodiment, a femtosecond-based laser process having a wavelength close to or in the UV range provides a cleaner ablation process than a femtosecond-based laser process having a wavelength close to or in the IR range. In a specific such embodiment, a femtosecond-based laser process suitable for semiconductor wafer or substrate scribing is based on a laser having a wavelength of approximately less than or equal to 540 nanometers. In a particular such embodiment, pulses of approximately less than or equal to 400 femtoseconds of the laser having the wavelength of approximately less than or equal to 540 nanometers are used. However, in an alternative embodiment, dual laser wavelengths (e.g., a combination of an IR laser and a UV laser) are used.

Figure 2C:
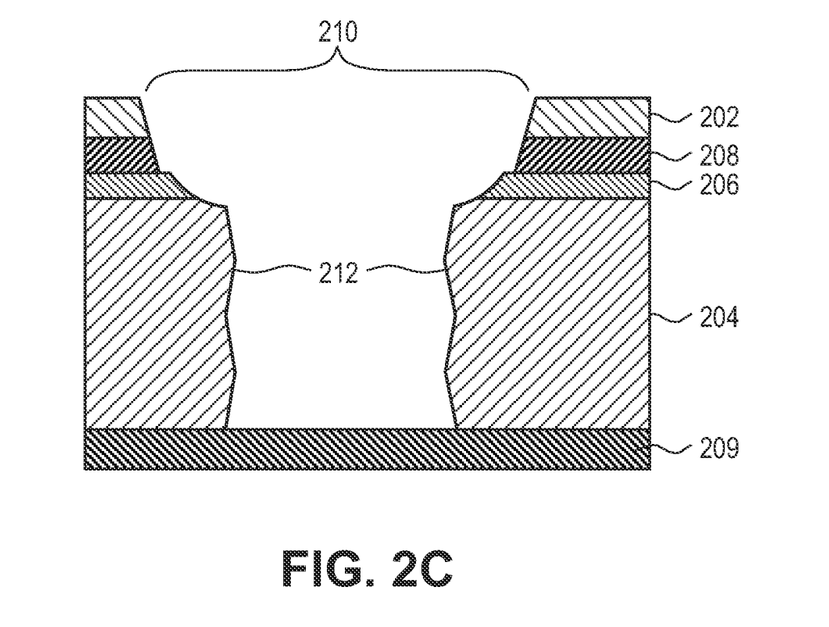

Returning to FIG. 1, and turning to corresponding FIG. 2C, the semiconductor wafer is next plasma etched at operation 106. As illustrated in FIG. 2C, the plasma etch front proceeds through the gaps in the patterned mask 202. In accordance with an embodiment of the present invention, etching the semiconductor wafer includes anisotropically etching the trenches 210 formed with the laser scribing process. In one embodiment, the anisotropic etching exposes a back side tape 209 on the semiconductor wafer or substrate 204. In one embodiment, the plasma etching operation employs a through-silicon via type etch process. In one embodiment, a conventional Bosch-type dep/etch/dep process may be used to etch through the substrate. Generally, a Bosch-type process consists of three sub-steps: deposition (e.g., polymer deposition), a directional bombardment etch, and an isotropic chemical etch which is run through many iterations (cycles) until silicon is etched through. In one embodiment, anisotropically etching the semiconductor wafer comprises performing iterations of such a cyclic process until a back side tape is exposed at the bottom of the etched trench.

As a result of the Bosch process, the sidewall 212 surfaces takes a scallop structure which is rough, as illustrated in FIG. 2C. This is particularly the effect where the laser scribing process generates an open trench much rougher than that which a lithographically defined etch process achieves. Such a rough die edge leads to lower than expected die break strength. In addition, the deposition sub-step in a Bosch process generates a Flourine-rich Teflon-type organic film to protect the already etched sidewall which is not removed from the sidewall as the etch front proceeds (generally, such polymer is only removed periodically from the bottom of the anisotropically etched trench).

In a specific embodiment, during the etch process the etch rate of the material of the silicon of the semiconductor wafer 204 is greater than 25 microns per minute. An ultra-high-density plasma source may be used for the plasma etching portion of the die singulation process. An example of a process chamber suitable to perform such a plasma etch process is the Applied Centura® Silvia™ Etch system available from Applied Materials of Sunnyvale, Calif., USA. The Applied Centura® Silvia™ Etch system combines the capacitive and inductive RF coupling, which gives more independent control of the ion density and ion energy than is possible with capacitive coupling only, even with the improvements provided by magnetic enhancement. This combination enables effective decoupling of the ion density from ion energy, so as to achieve relatively high density plasmas without the high, potentially damaging, DC bias levels, even at very low pressures. Multi-RF source configurations also results in an exceptionally wide process window. However, any plasma etch chamber capable of etching silicon may be used. In an exemplary embodiment, a deep silicon etch is used to etch a single crystalline silicon substrate or wafer at an etch rate greater than approximately 40% of conventional silicon etch rates (e.g., 40 μm, or more) while maintaining essentially precise profile control and virtually scallop-free sidewalls. In a specific embodiment, a through-silicon via type etch process is used. The etch process is based on a plasma generated from a reactive gas, which generally is a fluorine-based gas such as $SF_6$, $C_4F_6$, $C_4F_8$, $CHF_3$, $XeF_2$, or any other reactant gas capable of etching silicon at a relatively fast etch rate.

To summarize FIGS. 2A-2C, the die singulation process includes first laser scribing to remove mask layer, passivation layer, and device layers as to cleanly expose silicon substrate, followed by plasma etching to dice through silicon substrate. For the etching, a Bosch process may be used which is based on three sub-steps, i.e. deposition, directional bombardment etch, and isotropic chemical etch and is run many iterations (cycles) until silicon is etched through. As a result of the Bosch process, however, the sidewall surface takes a scallop structure which is rough, as illustrated in FIG. 2C. Particularly since the laser scribing process typically generates an open trench much rougher than that lithography process achieves, the sidewall roughness can be much higher than compared with other silicon etching processes. This leads to lower than expected die break strength. In addition, the deposition sub-step in a Bosch process may generate a Flourine-rich Teflon-type organic film to protect the already etched sidewall.

Figure 2D:
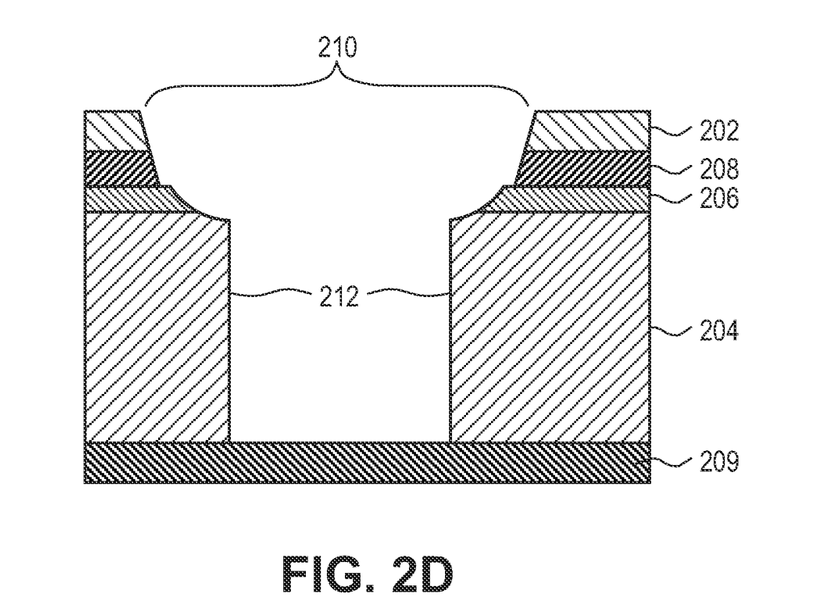

Returning to FIG. 1, and turning to corresponding FIG. 2D, following the anisotropic plasma etch operation 106, the integrated circuits are in singulated form. Subsequently, an isotropic chemical wet or plasma etch is applied to smoothen the sidewall 212 by gently etching a thin layer of substrate (e.g., silicon) off the sidewall at operation 108. An exemplary isotropic plasma etch employs a fluorine or chlorine-based chemistry, which is preferably non-polymerizing. Exemplary non-polymerizing plasma etch chemistries consist essentially of $NF_3$ or $SF_6$, $Cl_2$ or $SiF_4$ and are substantially free of hydrocarbons such as $CHF_3$, or fluorocarbons such as $C_4F_8$. Such plasma etch chemistries may optionally further include an oxidizer such as $O_2$ to further enhance the etch rate of the substrate 204. A plasma isotropic etch is generally to be within 1 to 90 sec, with other suitable etch process parameters, such as temperature and pressure depending on the die thickness, to minimize undercut at the device layer/Si interface. In embodiments, the isotropic etch is performed in the same chamber as the anisotropic etch, for example immediately following termination of the anisotropic etch operation. In other embodiments, the isotropic etch is performed in a separate chamber, such as any chamber with a downstream plasma source known in the art. In embodiments, the wafer temperature may be relatively high (e.g., 80-100° C.) upon initiation of the isotropic etch because the high plasma powers employed in the high-rate and relatively long (e.g., 1-3 minutes) anisotropic etch have heated the wafer. This elevated wafer temperature has been found to enhance the isotropic character, as well as the etch rate of the isotropic etch performed immediately following the anisotropic etch. The isotropic etch step removes the Flourine or Carbon-rich polymer layer that was deposited on the die sidewall by the anisotropic etch.

Figure 4:
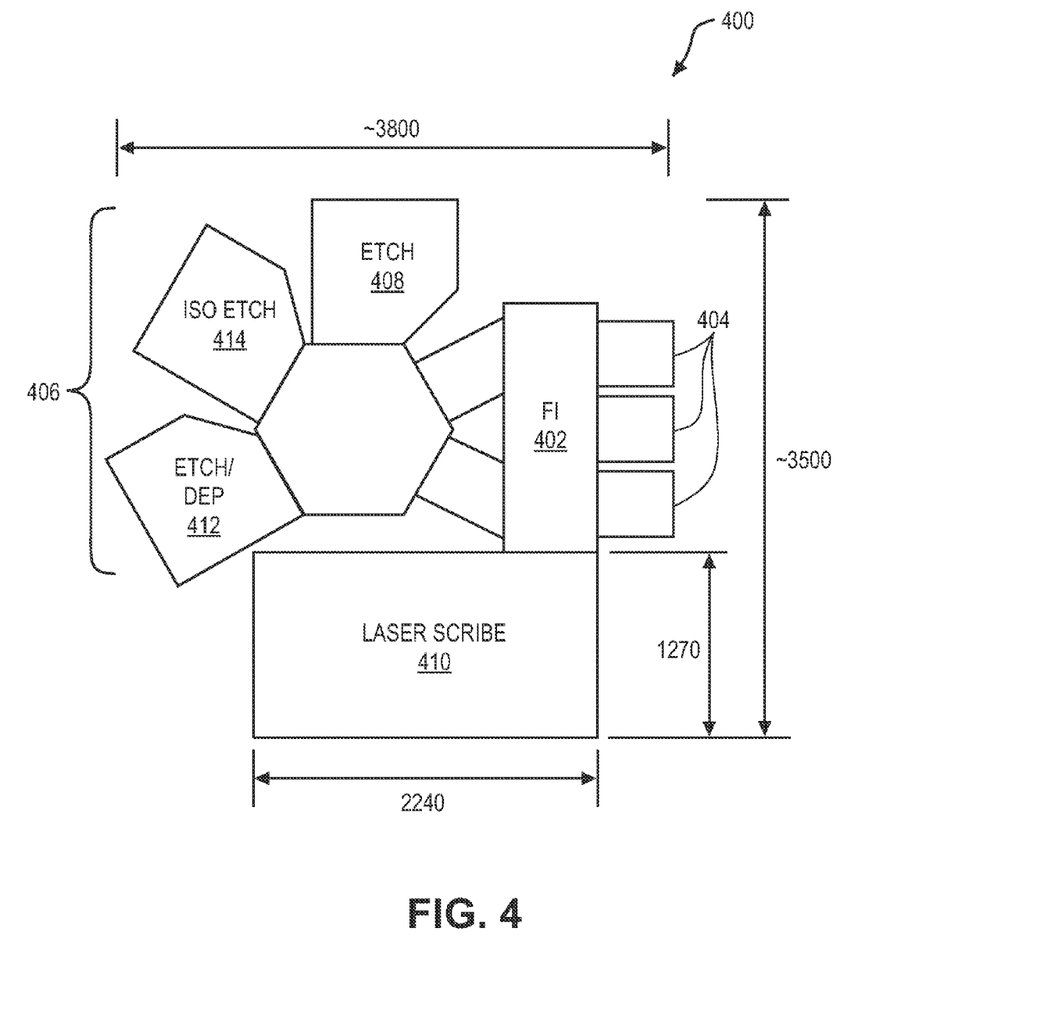
FIG. 4 illustrates a plan view schematic of an integrated dicing system in accordance with an embodiment of the present invention.

Referring to FIG. 4, a process tool 400 includes a factory interface 402 (FI) having a plurality of load locks 404 coupled therewith. A cluster tool 406 is coupled with the factory interface 402. The cluster tool 406 includes one or more plasma etch chambers, such as anisotropic plasma etch chamber 408 and isotropic plasma etch chamber 414. A laser scribe apparatus 410 is also coupled to the factory interface 402. The overall footprint of the process tool 400 may be, in one embodiment, approximately 3500 millimeters (3.5 meters) by approximately 3800 millimeters (3.8 meters), as depicted in FIG. 4.

In an embodiment, the laser scribe apparatus 410 houses a femtosecond-based laser. The femtosecond-based laser is suitable for performing a laser ablation portion of a hybrid laser and etch singulation process, such as the laser ablation processes described above. In one embodiment, a moveable stage is also included in laser scribe apparatus 400, the moveable stage configured for moving a wafer or substrate (or a carrier thereof) relative to the femtosecond-based laser. In a specific embodiment, the femtosecond-based laser is also moveable. The overall footprint of the laser scribe apparatus 410 may be, in one embodiment, approximately 2240 millimeters by approximately 1270 millimeters, as depicted in FIG. 4.

In an embodiment, the one or more plasma etch chambers 408 is configured for etching a wafer or substrate through the gaps in a patterned mask to singulate a plurality of integrated circuits. In one such embodiment, the one or more plasma etch chambers 408 is configured to perform a deep silicon etch process. In a specific embodiment, the one or more plasma etch chambers 408 is an Applied Centura® Silvia™ Etch system, available from Applied Materials of Sunnyvale, Calif., USA. The etch chamber may be specifically designed for a deep silicon etch used to create singulate integrated circuits housed on or in single crystalline silicon substrates or wafers. In an embodiment, a high-density plasma source is included in the plasma etch chamber 408 to facilitate high silicon etch rates. In an embodiment, more than one etch chamber is included in the cluster tool 406 portion of process tool 400 to enable high manufacturing throughput of the singulation or dicing process.

The factory interface 402 may be a suitable atmospheric port to interface between an outside manufacturing facility with laser scribe apparatus 410 and cluster tool 406. The factory interface 402 may include robots with arms or blades for transferring wafers (or carriers thereof) from storage units (such as front opening unified pods) into either cluster tool 406 or laser scribe apparatus 410, or both.

Cluster tool 406 may include other chambers suitable for performing functions in a method of singulation. For example, in one embodiment, in place of an additional etch chamber, a deposition chamber 412 is included. The deposition chamber 412 may be configured for mask deposition on or above a device layer of a wafer or substrate prior to laser scribing of the wafer or substrate, e.g., by a uniform spin-on process. In one such embodiment, the deposition chamber 412 is suitable for depositing a uniform layer with a conformality factor within approximately 10%.

In embodiments, the isotropic plasma etch chamber 414 is employs a downstream plasma source, such as a high frequency magnetron or inductively coupled source disposed a distance upstream of a process chamber where a substrate is housed during isotropic etch processing described elsewhere herein. In embodiments the isotropic plasma etch chamber 414 is plumbed to use exemplary non-polymerizing plasma etch source gases, such as one or more of $NF_3$ or $SF_6$, $Cl_2$ or $SiF_4$, and one or more oxidizers, such as $O_2$.

Figure 5:
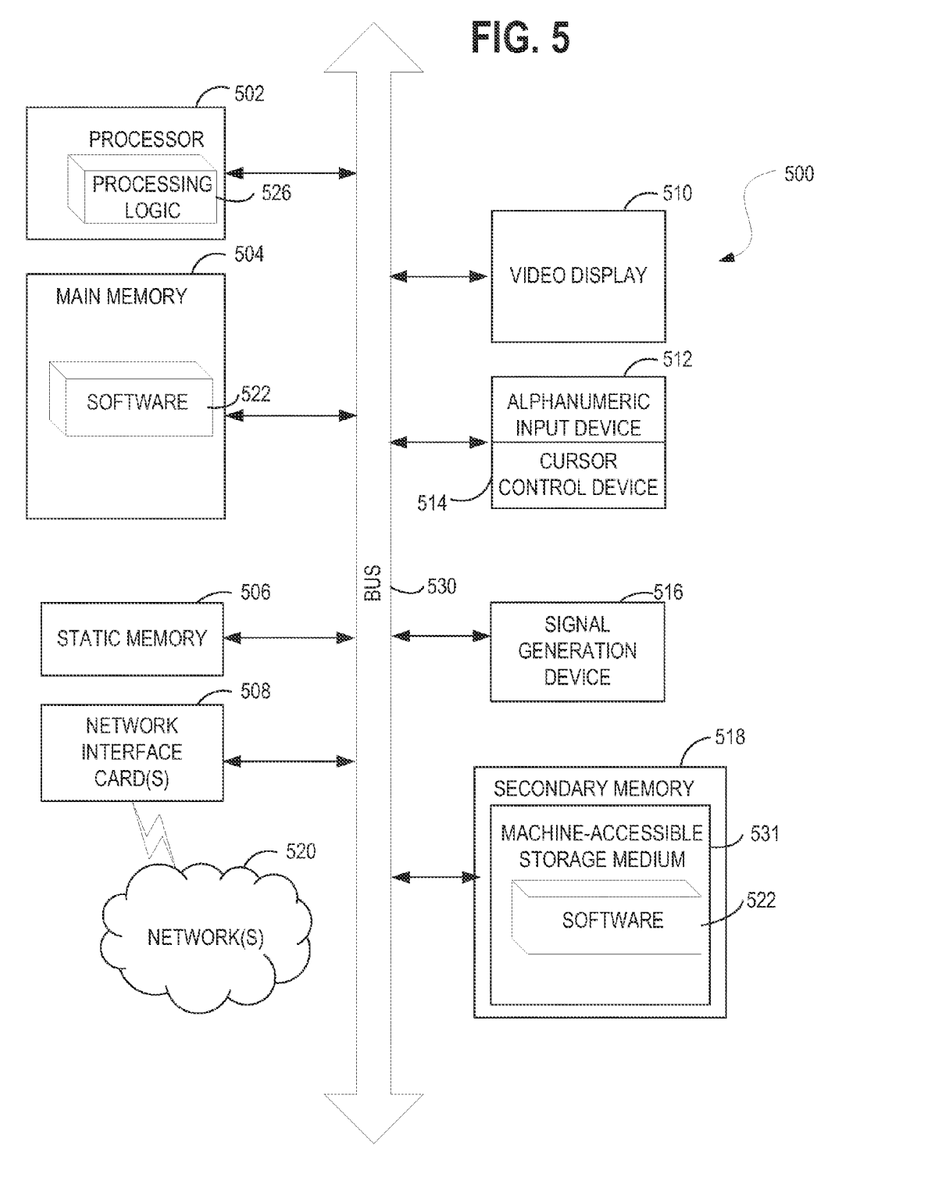
FIG. 5 illustrates a block diagram of an exemplary computer system which controls automated performance of one or more operation in the masking, laser scribing, plasma dicing methods described herein, in accordance with an embodiment of the present invention.

FIG. 5 illustrates a computer system 500 within which a set of instructions, for causing the machine to execute one or more of the scribing methods discussed herein may be executed. The exemplary computer system 500 includes a processor 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a secondary memory 518 (e.g., a data storage device), which communicate with each other via a bus 530.

Processor 502 represents one or more general-purpose processing devices such as a microprocessor, central processing unit, or the like. More particularly, the processor 502 may be a complex instruction set computing (CISC) microprocessor, reduced instruction set computing (RISC) microprocessor, very long instruction word (VLIW) microprocessor, etc. Processor 502 may also be one or more special-purpose processing devices such as an application specific integrated circuit (ASIC), a field programmable gate array (FPGA), a digital signal processor (DSP), network processor, or the like. Processor 502 is configured to execute the processing logic 526 for performing the operations and steps discussed herein.

The computer system 500 may further include a network interface device 508. The computer system 500 also may include a video display unit 510 (e.g., a liquid crystal display (LCD) or a cathode ray tube (CRT)), an alphanumeric input device 512 (e.g., a keyboard), a cursor control device 514 (e.g., a mouse), and a signal generation device 516 (e.g., a speaker).

The secondary memory 518 may include a machine-accessible storage medium (or more specifically a computer-readable storage medium) 531 on which is stored one or more sets of instructions (e.g., software 522) embodying any one or more of the methodologies or functions described herein. The software 522 may also reside, completely or at least partially, within the main memory 504 and/or within the processor 502 during execution thereof by the computer system 500, the main memory 504 and the processor 502 also constituting machine-readable storage media. The software 522 may further be transmitted or received over a network 520 via the network interface device 508.

While the machine-accessible storage medium 531 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, optical and magnetic media, and other non-transitory machine-readable storage medium.

It is to be understood that the above description is intended to be illustrative, and not restrictive. For example, while flow diagrams in the figures show a particular order of operations performed by certain embodiments of the invention, it should be understood that such order is not required (e.g., alternative embodiments may perform the operations in a different order, combine certain operations, overlap certain operations, etc.). Furthermore, many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. The scope of the invention should, therefore, be determined with reference to the appended claims, along with the full scope of equivalents to which such claims are entitled.

What is claimed is:

1. A method of dicing a semiconductor wafer comprising a plurality of integrated circuits, the method comprising:
   forming a mask above the semiconductor wafer, the mask covering and protecting the integrated circuits;
   patterning the mask with a laser scribing process to provide a patterned mask with gaps, exposing regions of the semiconductor wafer between the integrated circuits, wherein patterning the mask further comprises direct writing a pattern with a femtosecond laser having a wavelength less than or equal to 540 nanometers and a laser pulse width less than or equal to 400 femtoseconds;
   after patterning the mask with the laser scribing process, anisotropically etching the semiconductor wafer through the gaps in the patterned mask to advance an etched trench completely through the semiconductor wafer to singulate the integrated circuits; and
   isotropically etching the anisotropically etched trench after completely advancing the etched trench through the semiconductor wafer;
   wherein anisotropically etching the semiconductor wafer comprises performing iterations of a cyclic process including polymer deposition, directional bombardment etch, and isotropic chemical etch, until a back side tape is exposed at the bottom of the etched trench;
   wherein isotropically etching the anisotropically etched trench comprises an isotropic plasma etch employing a non-polymerizing fluorine or chlorine-based chemistry; and
   wherein the non-polymerizing fluorine or chlorine-based chemistry consists essentially of $NF_3$ or $SF_6$, $C_{12}$ or $SiF_4$.

2. The method of claim 1, wherein the isotropic etch removes anisotropic etch byproducts, roughness, or sidewall scalloping from anisotropically etched die sidewalls after die singulation.

3. The method of claim 1, wherein the isotropic etch removes polymers comprising carbon and fluorine from the anisotropically etched trench.

4. The method of claim 1, wherein the non-polymerizing fluorine or chlorine-based chemistry further includes an oxidizer.

5. The method of claim 1, wherein the non-polymerizing fluorine or chlorine-based chemistry is substantially free of hydrocarbons and fluorocarbons.

6. The method of claim 1, wherein a same plasma etch chamber is employed for both anisotropically etching and isotropically etching.

7. The method of claim 1, wherein the isotropic etch is performed for less than 90 seconds.

8. The method of claim 1, wherein anisotropically etching the semiconductor wafer comprises performing iterations of a cyclic process including polymer deposition, directional bombardment etch, and isotropic chemical etch, until a back side tape is exposed at the bottom of the etched trench; and
   wherein isotropically etching the anisotropically etched trench comprises a wet chemical etch.

9. The method of claim 1, wherein the semiconductor wafer has a diameter of at least 300 mm and has a thickness of 300 μm to 800 μm.

10. The method of claim 1, wherein patterning the mask further comprises direct writing a pattern with a femtosecond laser having a wavelength less than or equal to 540 nanometers and a laser pulse width less than or equal to 400 femtoseconds.

11. The method of claim 1, wherein forming the mask further comprises depositing a water-soluble mask layer on the semiconductor wafer.

12. The method of claim 11, wherein the water-soluble mask layer comprises PVA polyvinyl alcohol (PVA).

13. The method of claim 12, wherein forming the mask further comprises depositing a multi-layered mask comprising the water-soluble mask layer as a base coat and a non-water-soluble mask layer as an overcoat on top of the base coat.

14. The method of claim 11, wherein the non-water-soluble mask layer is a photo-resist or a polyimide (PI).

15. A method of dicing a substrate comprising a plurality of integrated circuits (ICs), the method comprising:
   patterning, with a laser scribe scribing process, a multi-layered mask, the multi-layered mask disposed above the substrate, to form a trench exposing regions of the substrate between the IC; wherein patterning the mask further comprises direct writing a pattern with a femtosecond laser having a wavelength less than or equal to 540 nanometers and a laser pulse width less than or equal to 400 femtoseconds;
   after patterning the mask with the laser scribing process, anisotropically etching the trench completely through the substrate, wherein anisotropic etching comprises polymer deposition, directional bombardment etch, and isotropic chemical etch; and
   after etching the trench completely through the substrate, isotropically etching the trench;
   wherein anisotropically etching the semiconductor wafer comprises performing iterations of a cyclic process including polymer deposition, directional bombardment etch, and isotropic chemical etch, until a back side tape is exposed at the bottom of the etched trench;
   wherein isotropically etching the anisotropically etched trench comprises an isotropic plasma etch employing a non-polymerizing fluorine or chlorine-based chemistry; and
   wherein the non-polymerizing fluorine or chlorine-based chemistry consists essentially of $NF_3$ or $SF_6$, $C_{12}$ or $SiF_4$.

16. The method of claim 15, wherein the multi-layered mask comprises a water-soluble mask layer as a base coat and a non-water-soluble mask layer as an overcoat on top of the base coat.

17. The method of claim 15, wherein the isotropic etch removes anisotropic etch byproducts, roughness, or sidewall scalloping from anisotropically etched die sidewalls after die singulation.

18. The method of claim 15, wherein the isotropic etch removes polymers comprising carbon and fluorine from the anisotropically etched trench.

* * * * *